US011812546B2

United States Patent
Nitta et al.

(10) Patent No.: US 11,812,546 B2
(45) Date of Patent: Nov. 7, 2023

(54) HIGH-FREQUENCY CIRCUIT

(71) Applicants: SUMITOMO ELECTRIC PRINTED CIRCUITS, INC., Koka (JP); SUMITOMO ELECTRIC INDUSTRIES, LTD., Osaka (JP)

(72) Inventors: Koji Nitta, Osaka (JP); Takafumi Uemiya, Osaka (JP); Suguru Yamagishi, Osaka (JP); Shigeki Shimada, Osaka (JP); Hiroshi Ueda, Osaka (JP); Satoshi Kiya, Koka (JP)

(73) Assignees: SUMITOMO ELECTRIC PRINTED CIRCUITS, INC., Koka (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/783,094

(22) PCT Filed: May 10, 2021

(86) PCT No.: PCT/JP2021/017770
§ 371 (c)(1),
(2) Date: Jun. 7, 2022

(87) PCT Pub. No.: WO2021/230216
PCT Pub. Date: Nov. 18, 2021

(65) Prior Publication Data
US 2022/0418094 A1     Dec. 29, 2022

(30) Foreign Application Priority Data
May 13, 2020    (JP) .................................. 2020-084546

(51) Int. Cl.
*H05K 1/02*            (2006.01)

(52) U.S. Cl.
CPC .......... *H05K 1/0242* (2013.01); *H05K 1/024* (2013.01); *H05K 2201/0715* (2013.01); *H05K 2201/09609* (2013.01); *H05K 2201/09854* (2013.01)

(58) Field of Classification Search
CPC .... H05K 1/0222; H05K 1/024; H05K 1/0242; H05K 2201/715
See application file for complete search history.

(56) References Cited

U.S. PATENT DOCUMENTS

| 5,770,981 A | 6/1998 | Koizumi et al. |
| 2012/0274526 A1 | 11/2012 | Koriyama |
| 2018/0054892 A1* | 2/2018 | Tourne ................. H05K 3/0035 |

FOREIGN PATENT DOCUMENTS

| JP | H08-274513 A | 10/1996 |
| JP | 2016-225513 A | 12/2016 |

(Continued)

*Primary Examiner* — Jeremy C Norris
(74) *Attorney, Agent, or Firm* — Oliff PLC

(57) ABSTRACT

A high-frequency circuit includes a first dielectric layer, a circuit layer, a second dielectric layer arranged in this order, the circuit layer includes a transmission line of a high-frequency signal and a ground pattern disposed around the transmission line. An electromagnetic wave shield is disposed in the first dielectric layer and the second dielectric layer around the transmission line. The electromagnetic wave shield includes a first ground electric conductor formed on an inner surface of at least one first hole formed to extend through the first dielectric layer without extending through the ground pattern, and a second ground electric conductor formed on an inner surface of at least one second hole formed to extend through the second dielectric layer without extending through the ground pattern. The first ground electric conductor and the second ground electric conductor are each electrically connected to the ground pattern.

13 Claims, 6 Drawing Sheets

(56) References Cited

FOREIGN PATENT DOCUMENTS

| | | |
|---|---|---|
| JP | 2018-200982 A | 12/2018 |
| JP | 2019-029609 A | 2/2019 |
| JP | 2019-197785 A | 11/2019 |
| WO | 2011/078061 A1 | 6/2011 |

* cited by examiner

HIGH-FREQUENCY CIRCUIT

TECHNICAL FIELD

The present disclosure relates to a high-frequency circuit.

The present application claims priority based on Japanese Patent Application No. 2020-084546 filed on May 13, 2020, and the entire contents of the Japanese patent application are incorporated herein by reference.

BACKGROUND ART

PTL 1 discloses a structure including multiple shield vias that are electrically connected to a front surface ground and a back surface ground of a dielectric substrate.

CITATION LIST

Patent Literature

PTL 1: Japanese Unexamined Patent Application Publication No. 8-274513

SUMMARY OF INVENTION

An aspect of the present disclosure provides a high-frequency circuit. The high-frequency circuit according to the present disclosure includes a first dielectric layer, a circuit layer disposed on the first dielectric layer and including a transmission line of a high-frequency signal and a ground pattern disposed around the transmission line, a second dielectric layer disposed such that the circuit layer is located between the first dielectric layer and the second dielectric layer, and an electromagnetic wave shield disposed in the first dielectric layer and the second dielectric layer around the transmission line. The electromagnetic wave shield includes a first ground electric conductor formed on an inner surface of at least one first hole formed to extend through the first dielectric layer without extending through the ground pattern, and a second ground electric conductor formed on an inner surface of at least one second hole formed to extend through the second dielectric layer without extending through the ground pattern. The first ground electric conductor and the second ground electric conductor are each electrically connected to the ground pattern.

DESCRIPTION OF EMBODIMENTS

Problems to be Solved by Present Disclosure

Shield vias are formed by forming multiple through-holes each having a circular shape in plan view and extending through a dielectric substrate in the thickness direction of the dielectric substrate, and providing an electric conductor such as copper in the through-holes. The shield vias are used as an electromagnetic wave shield that prevents electromagnetic waves from leaking in the dielectric substrate.

Figure 7:
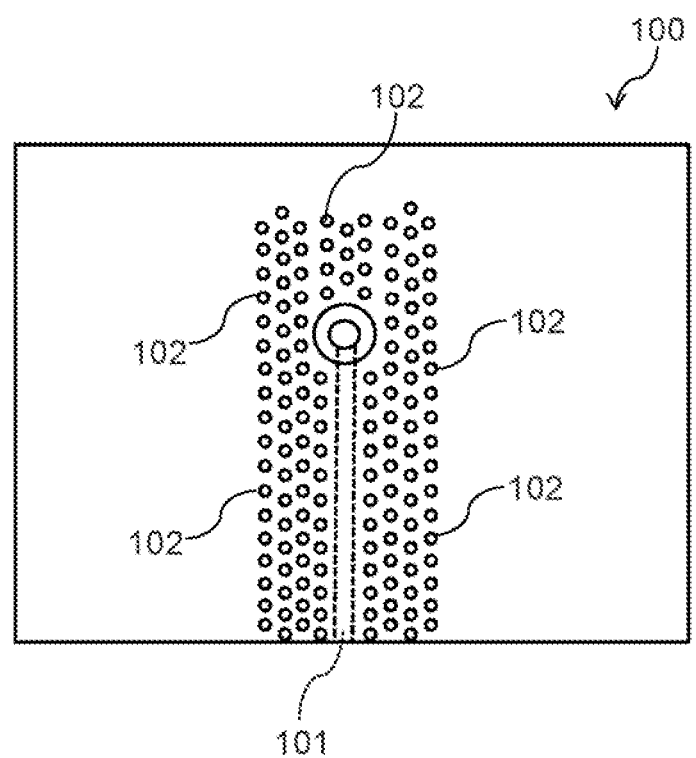
FIG. 7 is a plan view of a high-frequency circuit according to a comparative example.

FIG. 7 illustrates an example of the structure of a high-frequency circuit 100 having a signal transmission line 101, in which multiple shield vias 102 are formed so as to surround the signal transmission line 101. Unnecessary electromagnetic waves are radiated from the signal transmission line 101 of high-frequency waves. The electromagnetic waves are noise for peripheral circuits and deteriorate characteristics of the peripheral circuits.

When the multiple shield vias 102 are provided around the signal transmission line 101, the multiple shield vias 102 function as an electromagnetic wave shield. This electromagnetic wave shield can shield electromagnetic waves leaking from the signal transmission line 101.

To form the shield vias 102, it is necessary to form holes in the high-frequency circuit 100. When the holes extend through the high-frequency circuit 100, the strength of an area where the shield vias 102 are provided decreases. Consequently, if the areas of the holes are increased, a region surrounded by the shield vias 102, that is, a region where the signal transmission line 101 is provided, and a region outside the shield vias 102 may be easily separated.

Accordingly, it is desirable to suppress the decrease in the strength of the circuit due to the formation of the holes, while preventing electromagnetic waves from leaking.

Advantageous Effects of Present Disclosure

The present disclosure suppresses a decrease in the strength of a circuit due to the formation of holes, while preventing electromagnetic waves from leaking.

1. Description of Embodiment of Present Disclosure (1) A high-frequency circuit according to an embodiment includes a first dielectric layer, a circuit layer disposed on the first dielectric layer and including a transmission line of a high-frequency signal and a ground pattern disposed around the transmission line, a second dielectric layer disposed such that the circuit layer is located between the first dielectric layer and the second dielectric layer, and an electromagnetic wave shield disposed in the first dielectric layer and the second dielectric layer around the transmission line. Since the high-frequency circuit includes the electromagnetic wave shield, electromagnetic waves propagating through the first dielectric layer and the second dielectric layer that are provided on both sides of the transmission line can be prevented from leaking. The electromagnetic wave shield includes a first ground electric conductor formed on an inner surface of at least one first hole formed to extend through the first dielectric layer without extending through the ground pattern, and a second ground electric conductor formed on an inner surface of at least one second hole formed to extend through the second dielectric layer without extending through the ground pattern, and the first ground electric conductor and the second ground electric conductor are each electrically connected to the ground pattern. Since the first hole and the second hole extending through the first dielectric layer and the second dielectric layer, respectively, do not extend through the ground pattern located around the transmission line, a decrease in the strength of the high-frequency circuit can be suppressed. Thus, the electromagnetic wave shield according to the embodiment can suppress the decrease in the strength of the high-frequency circuit due to the formation of the holes, while preventing the leakage of electromagnetic waves.

(2) The at least one first hole can include at least one first elongated hole having a longitudinal dimension in a direction in which the transmission line is surrounded, the longitudinal dimension being larger than a width dimension. An elongated hole tends to have a large area and thus is likely to result in a decrease in the strength of the high-frequency circuit. However, since the first hole does not extend through the ground pattern, the decrease in the strength of the high-frequency circuit can be effectively suppressed.

(3) The at least one second hole can include at least one second elongated hole having a longitudinal dimension in a direction in which the transmission line is surrounded, the longitudinal dimension being larger than a width dimension. An elongated hole tends to have a large area and thus is likely to result in a decrease in the strength of the high-frequency circuit. However, since the second hole does not extend through the ground pattern, the decrease in the strength of the high-frequency circuit can be effectively suppressed.

(4) The at least one first hole can include at least one first elongated hole having a longitudinal dimension in a direction in which the transmission line is surrounded, the longitudinal dimension being larger than a width dimension, and the at least one second hole can include at least one second elongated hole having a longitudinal dimension in a direction in which the transmission line is surrounded, the longitudinal dimension being larger than a width dimension. Each of the first elongated hole and the second elongated hole can include a first hole portion extending in a longitudinal direction of the transmission line on one side of the transmission line in a width direction, a second hole portion extending in the longitudinal direction of the transmission line on the other side of the transmission line in the width direction, and a third hole portion connecting the first hole portion to the second hole portion. In this case, the transmission line can be surrounded by a smaller number of elongated holes.

(5) Each of the first hole and the second hole can have a shape in which a size of an opening increases as a distance from the circuit layer increases. In this case, a shape suitable for a finish inspection of ground electric conductors formed inside the first hole and the second hole is obtained. Specifically, in the finish inspection, the inside of the holes can be observed from each of the front and back of the high-frequency circuit.

(6) Preferably, the high-frequency circuit further includes a first electric conductor layer disposed such that the first dielectric layer is located between the circuit layer and the first electric conductor layer, and a second electric conductor layer disposed such that the second dielectric layer is located between the circuit layer and the second electric conductor layer, in which the first hole is formed to extend through the first electric conductor layer, and the second hole is formed to extend through the second electric conductor layer. In this case, the first electric conductor layer prevents electromagnetic waves radiated from the transmission line from being radiated through the first dielectric layer in the thickness direction of the circuit. Furthermore, the second electric conductor layer prevents electromagnetic waves radiated from the transmission line from being radiated through the second dielectric layer in the thickness direction of the circuit.

(7) The first electric conductor layer is preferably electrically connected to the first ground electric conductor, and the second electric conductor layer is preferably electrically connected to the second ground electric conductor. In this case, the first electric conductor layer and the second electric conductor layer easily have a ground electric potential.

(8) The high-frequency circuit preferably further includes a cover film applied to a surface of at least one of the first electric conductor layer and the second electric conductor layer. In this case, even when the first hole and the second hole are elongated holes, the strength of the high-frequency circuit in which these elongated holes are formed can be ensured by the cover film.

2. Details of Embodiment of Present Disclosure

Hereinafter, in the drawings, the same reference signs denote the same components.

FIGS. 1 to 6 illustrate a high-frequency circuit 10 according to an embodiment. The high-frequency circuit 10 according to the embodiment is configured as a flexible printed circuit (FPC) used for transmitting high-frequency signals. The FPC has a structure in which a conductor such as copper foil is applied to a thin, flexible, insulator base film. The high-frequency circuit 10 is not limited to the FPC and may be a circuit formed on a rigid substrate.

Figure 2:
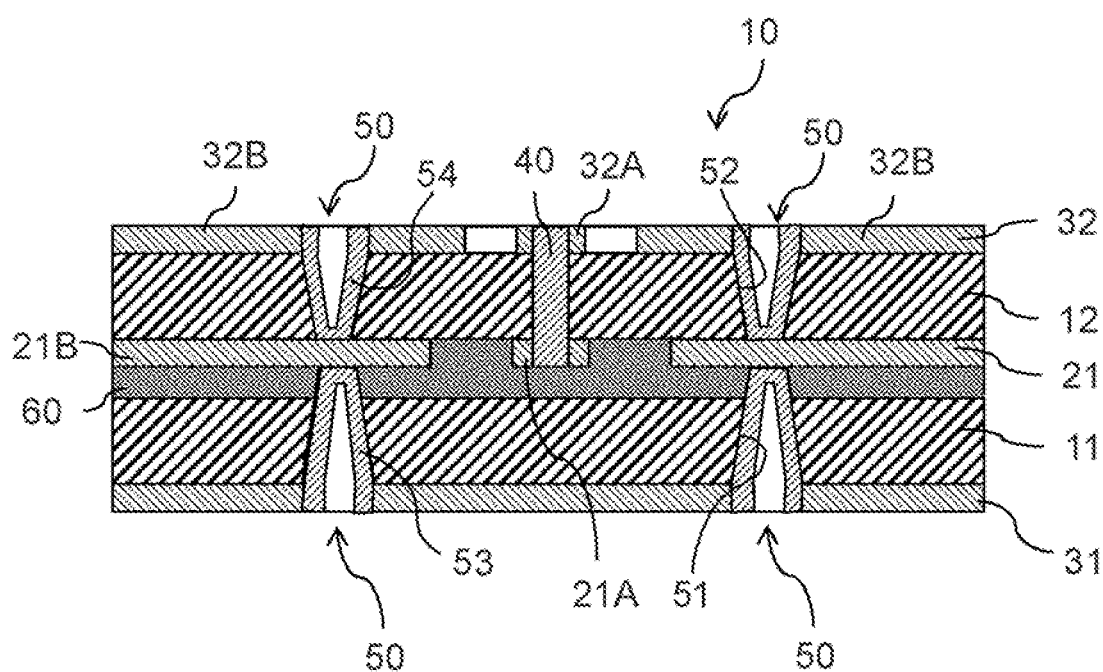
FIG. 2 is an A-A sectional view of FIG. 1.

As illustrated in FIG. 2, the high-frequency circuit 10 according to the embodiment includes a first dielectric layer 11, a circuit layer 21, a second dielectric layer 12, and an electromagnetic wave shield 50. The high-frequency circuit 10 further includes a first electric conductor layer 31 and a second electric conductor layer 32. The high-frequency circuit 10 according to the embodiment has a multilayer structure having three electric conductor layers. The number of electric conductor layers is not particularly limited and may be 2, 4, 5, or more. In FIG. 2, among the three electric conductor layers, the electric conductor layer disposed at a middle position is the circuit layer 21 having a transmission line 21A of high-frequency waves. The first electric conductor layer 31, which is one of the three electric conductor layers, is disposed on the lower side of FIG. 2, which is one side of the circuit layer 21 in the thickness direction. The second electric conductor layer 32, which is the remaining one of the three electric conductor layers, is disposed on the upper side of FIG. 2, which is the other side of the circuit layer 21 in the thickness direction.

Figure 3:
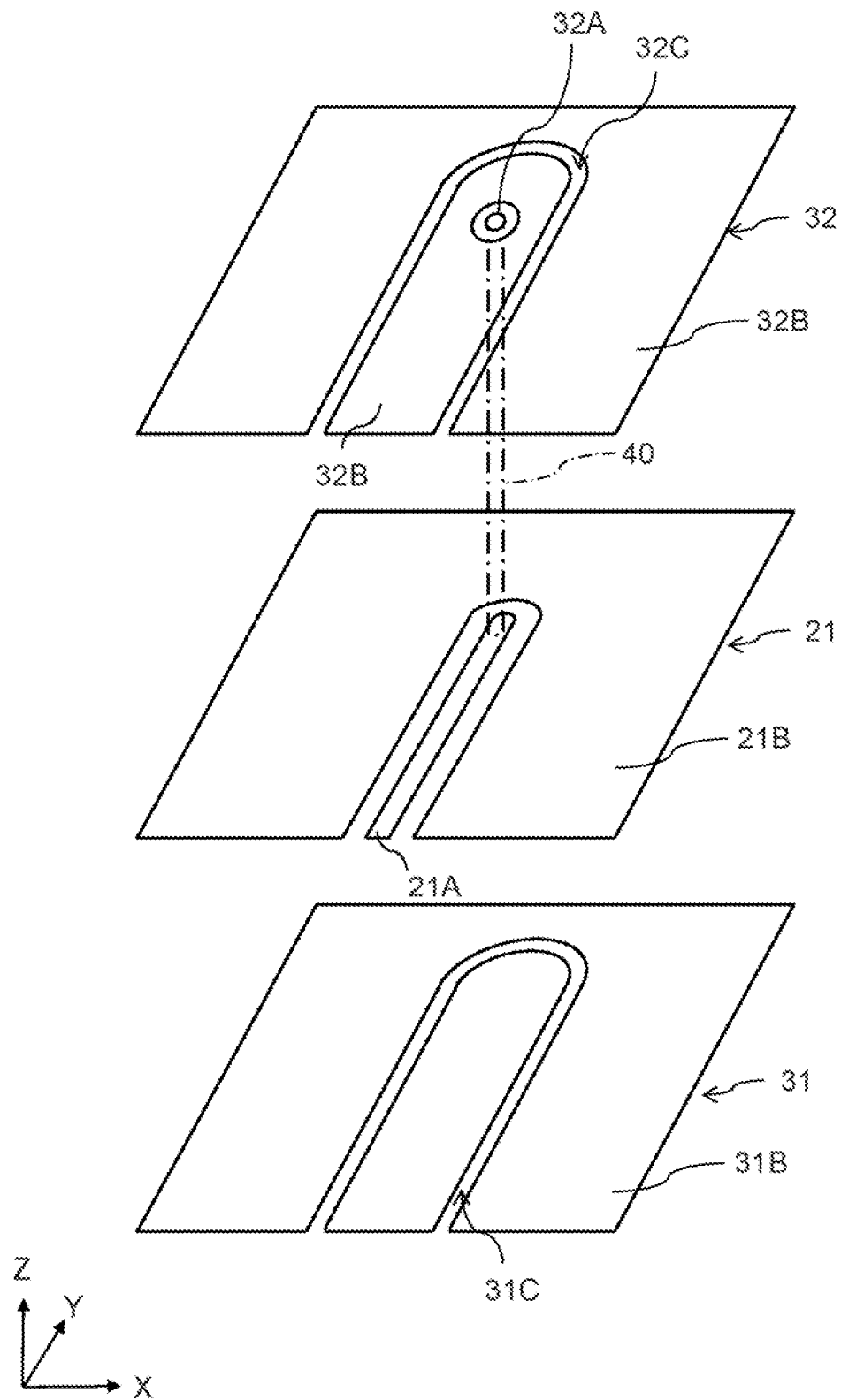
FIG. 3 is an exploded perspective view of a first electric conductor layer, a circuit layer, and a second electric conductor layer.

As illustrated in FIG. 3, the circuit layer 21 has a transmission line 21A and a ground pattern 21B located around the transmission line 21A. The region between the transmission line 21A and the ground pattern 21B is removed by etching, so that the transmission line 21A and the ground pattern 21B are insulated from each other. In FIG. 3, the transmission line 21A is formed linearly, but may be formed in a curved manner.

As illustrated in FIG. 2, the first dielectric layer 11 is disposed between the circuit layer 21 and the first electric conductor layer 31. That is, the circuit layer 21 is disposed on the first dielectric layer 11. In other words, the circuit layer 21 is disposed over the first electric conductor layer 31 with the first dielectric layer 11 therebetween. The circuit layer 21 and the first dielectric layer 11 are bonded to each other with an adhesive 60 therebetween. As illustrated in FIG. 3, substantially the entire surface of the first electric conductor layer 31 is constituted by a ground pattern 31B except for a first etched portion 31C that forms the electromagnetic wave shield 50 described later. That is, the first electric conductor layer 31 is a ground layer.

The adhesive 60 is preferably an adhesive having good flexibility and heat resistance. The adhesive 60 is, for example, a resin-based adhesive such as a modified polyphenylene ether-based, styrene resin-based, epoxy resin-based, butyral resin-based, or acrylic resin-based adhesive. A main component of the adhesive 60 is preferably a thermosetting resin. The lower limit of the curing temperature of the thermosetting resin serving as the main component of the adhesive 60 is preferably 120° C., and more preferably 150° C. The upper limit of the curing temperature of the thermosetting resin serving as the main component of the adhesive 60 is preferably 250° C., more preferably 230° C., and still more preferably 200° C. If the curing temperature of the thermosetting resin serving as the main component of the adhesive 60 is higher than the lower limit, the adhesive 60 is easily handled. If the curing temperature of the thermosetting resin serving as the main component of the adhesive 60 is lower than the upper limit, thermal deformation of the layers bonded with the adhesive 60 can be reduced during curing of the adhesive 60. The reduction of thermal deformation can suppress a decrease in the dimensional accuracy of the high-frequency circuit 10.

The lower limit of the relative dielectric constant of the adhesive 60 is preferably as small as possible; however, in reality, the limit is considered to be 1.5 in order to satisfy other conditions such as insulating properties and mechanical strength. The upper limit of the relative dielectric constant of the adhesive 60 is, for example, 3, preferably 2.8, and more preferably 2.6. If the relative dielectric constant of the adhesive 60 is smaller than the upper limit, dielectric loss can be reduced in the case of transmitting high-frequency signals through the high-frequency circuit 10.

As illustrated in FIG. 2, the second dielectric layer 12 is disposed between the circuit layer 21 and the second electric conductor layer 32. That is, the second dielectric layer 12 is disposed such that the circuit layer 21 is located between the first dielectric layer 11 and the second dielectric layer 12. As illustrated in FIG. 3, substantially the entire surface of the second electric conductor layer 32 is constituted by a ground pattern 32B except for a transmission line 32A of high-frequency signals and a second etched portion 32C that forms the electromagnetic wave shield 50. That is, the second electric conductor layer 32 is a ground layer.

As illustrated in FIG. 2, the first electric conductor layer 31 and the second electric conductor layer 32 that serve as ground layers are disposed on both the upper and lower sides of the circuit layer 21, that is, on both sides in the Z direction of FIG. 2. Accordingly, of electromagnetic waves radiated from the transmission line 21A, electromagnetic waves radiated to both sides of the high-frequency circuit 10 in the thickness direction, that is, to both sides in the Z direction of FIG. 2 are shielded by the first electric conductor layer 31 and the second electric conductor layer 32.

Some of the electromagnetic waves radiated from the transmission line 21A are radiated in the direction parallel to the X-Y plane of FIG. 2. The electromagnetic waves radiated in the direction parallel to the X-Y plane cannot be shielded by the first electric conductor layer 31 and the second electric conductor layer 32 and may leak to the outside of the high-frequency circuit 10 through the first dielectric layer 11 and the second dielectric layer 12. In view of this, the high-frequency circuit 10 according to the embodiment includes the electromagnetic wave shield 50 for shielding electromagnetic waves radiated in the direction parallel to the X-Y plane. Note that the X-Y plane is a plane perpendicular to the thickness direction of the high-frequency circuit 10. The Z direction is the thickness direction of the high-frequency circuit 10 and corresponds to a stacking direction of the aforementioned multilayer structure of the electric conductor layers.

In the high-frequency circuit 10 according to the embodiment, electromagnetic waves radiated in the Z direction are shielded by the first electric conductor layer 31 and the second electric conductor layer 32. Electromagnetic waves radiated in the direction parallel to the X-Y plane are shielded by the electromagnetic wave shield 50. Thus, electromagnetic waves radiated from the transmission line 21A can be effectively prevented from leaking to the outside of the high-frequency circuit 10. As a result, the influence of leaking electromagnetic waves on other peripheral circuits can be reduced.

Figure 1:
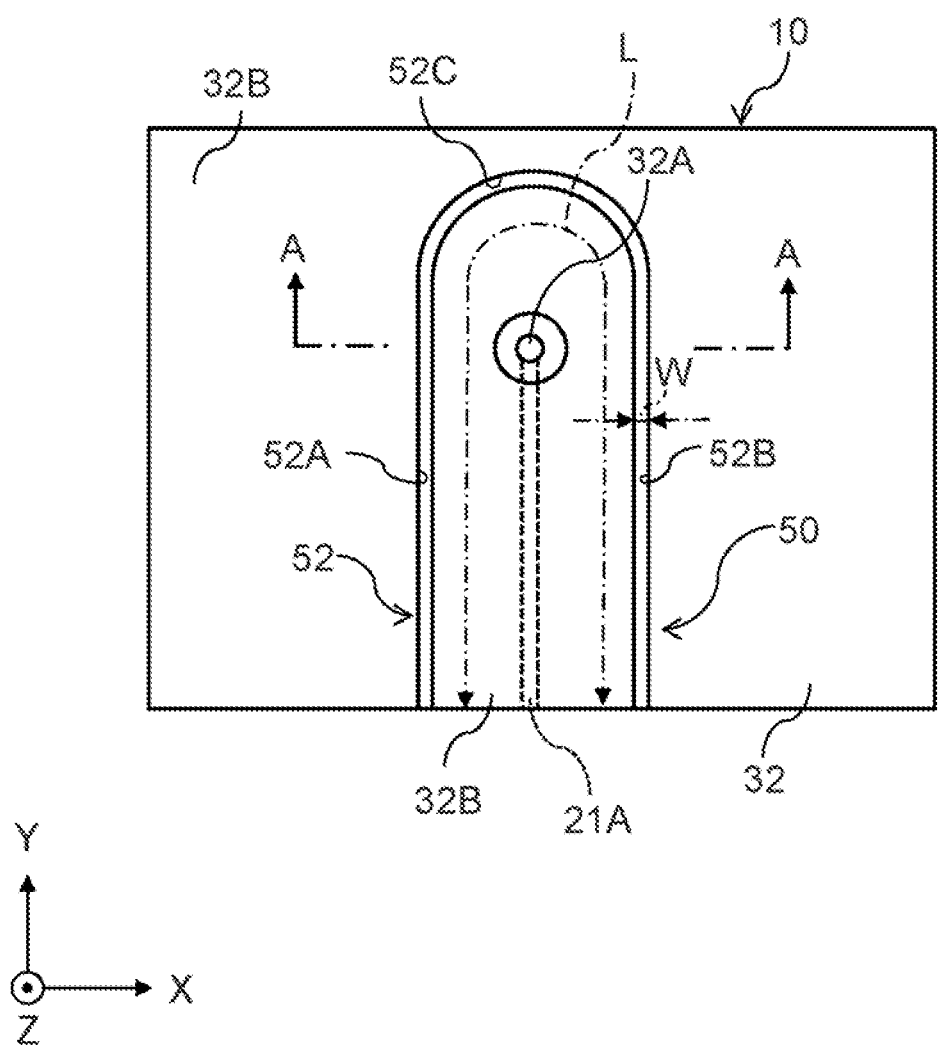
FIG. 1 is a plan view of a high-frequency circuit according to an embodiment.

The electromagnetic wave shield 50 is configured to function as a shield wall that shields electromagnetic waves passing through the first dielectric layer 11 and the second dielectric layer 12 around the transmission line 21A. As illustrated in FIG. 1, the electromagnetic wave shield 50 is formed so as to surround the transmission line 21A in plan view.

As illustrated in FIG. 2, the electromagnetic wave shield 50 is configured to include ground electric conductors on the inner surfaces of holes extending through the first dielectric layer 11 and the second dielectric layer 12. Since the ground electric conductors are provided so as to surround the transmission line 21A, they can shield electromagnetic waves passing through the first dielectric layer 11 and the second dielectric layer 12. The ground electric conductors here are electric conductors 53 and 54 described later. Incidentally, on the lower side of FIG. 1, the transmission line 21A is not surrounded by the electromagnetic wave shield 50. This is just because, for the convenience of drawing, the illustration of the transmission line 21A is omitted on the lower side of FIG. 1, and the illustration of the electromagnetic wave shield 50 is also omitted accordingly. Therefore, in reality, the electromagnetic wave shield 50 can completely surround the transmission line 21A.

As illustrated in FIG. 7, it has been a common knowledge that the shield vias 102 in the related art each have a circular shape in plan view. Therefore, to shield leaking electromagnetic waves, it is necessary to densely arrange multiple shield vias 102 so as to surround the signal transmission line 101. In contrast to this, as illustrated in FIG. 1, the electromagnetic wave shield 50 in the embodiment is formed not to have a circular shape but to have a shape elongated in a direction in which the transmission line 21A is surrounded, and thus leaking electromagnetic waves can be effectively shielded with a small number of holes.

Figure 4:
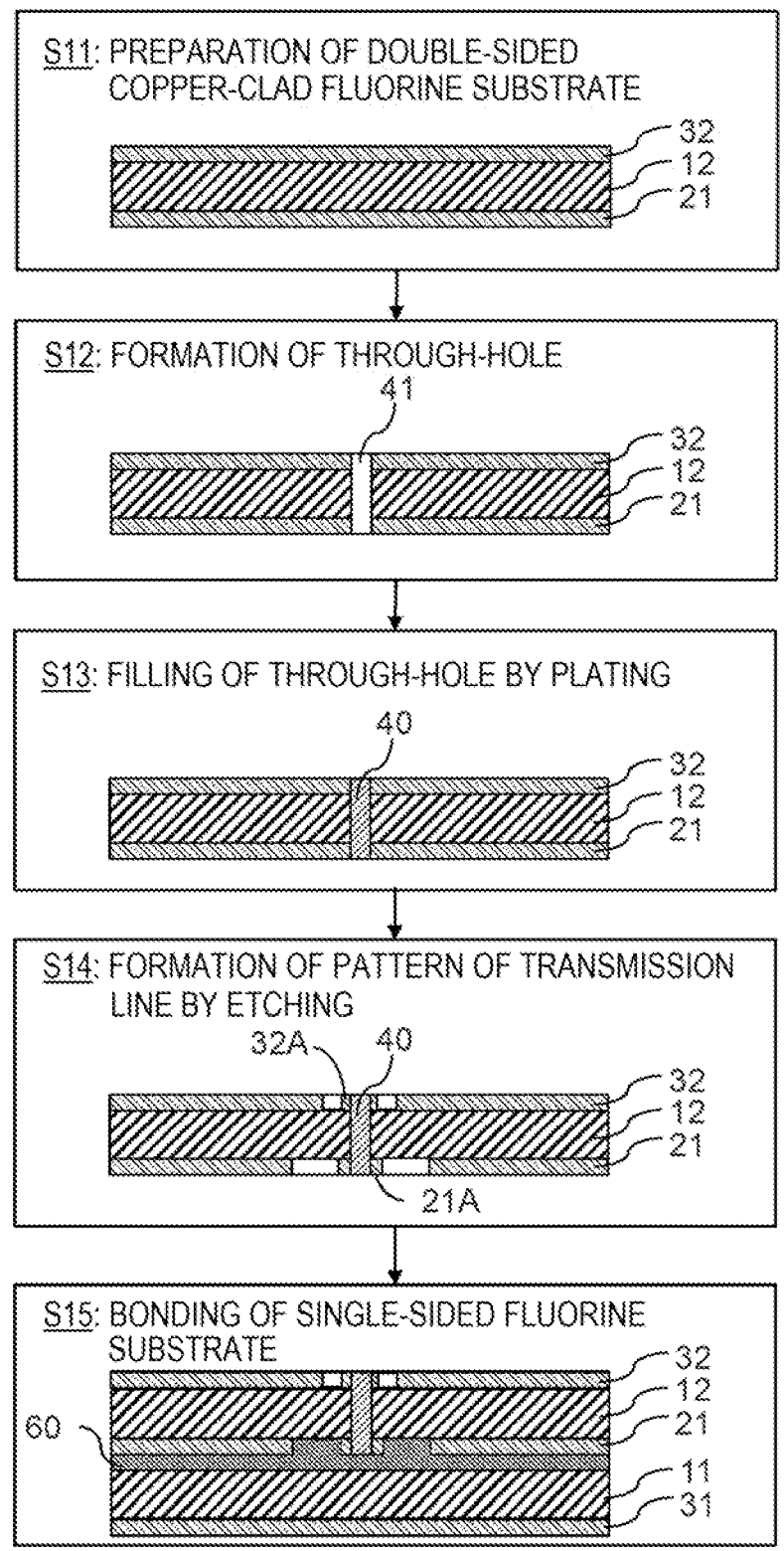
FIG. 4 includes views illustrating the first half of a process of producing the high-frequency circuit according to the embodiment.
Figure 5:
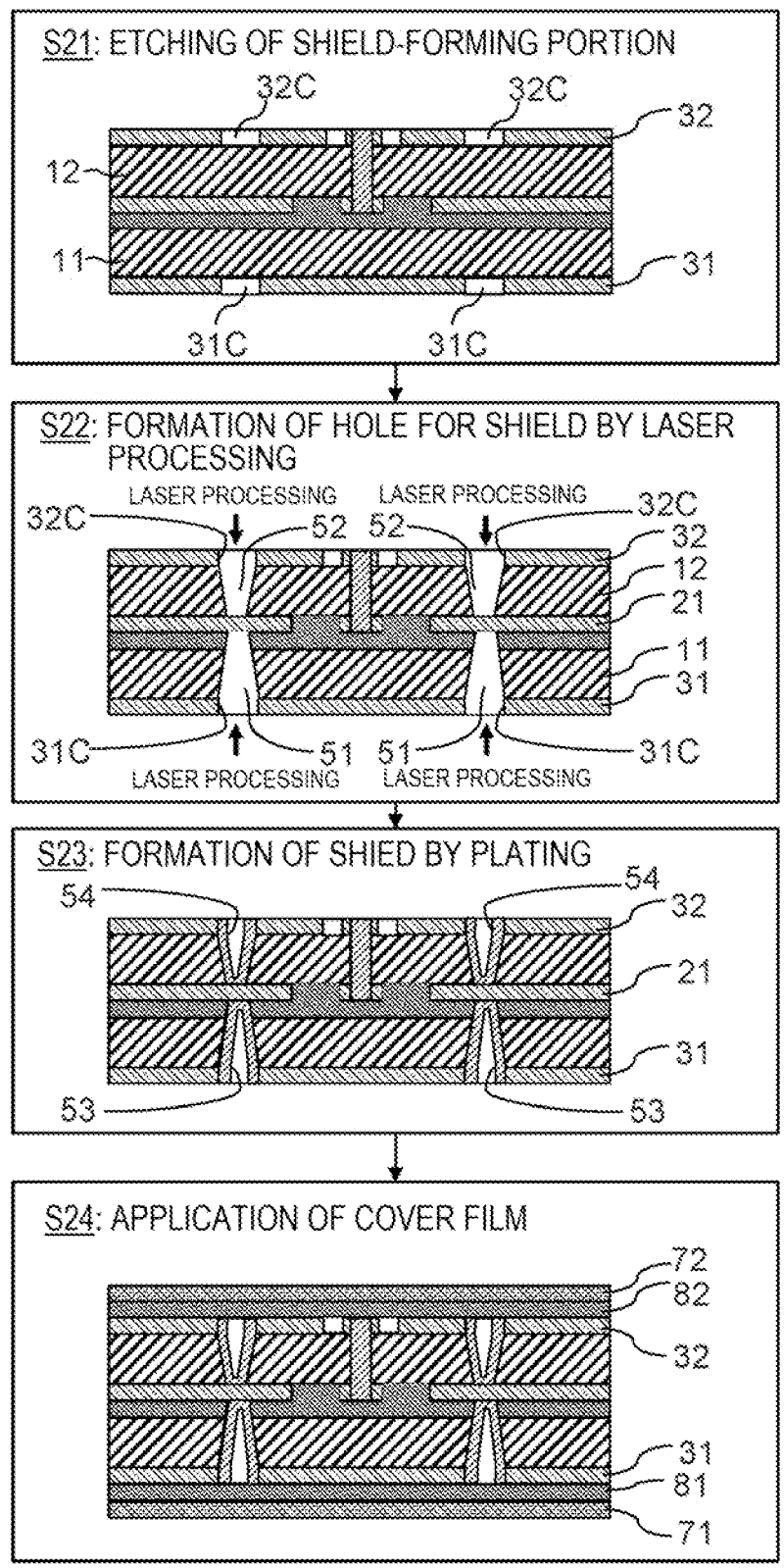
FIG. 5 includes views illustrating the second half of the process of producing the high-frequency circuit according to the embodiment.

FIGS. 4 and 5 illustrate a method for producing the high-frequency circuit 10 according to the embodiment. In step S11 illustrated in FIG. 4, a double-sided copper-clad fluororesin substrate is prepared as one example of a substrate. The double-sided copper-clad fluororesin substrate includes a fluororesin substrate constituting a second dielectric layer 12, copper constituting a circuit layer 21, and copper constituting a second electric conductor layer 32. The material of the substrate is not limited to a fluororesin.

In step S12, a through-hole 41 that extends through the circuit layer 21, the second dielectric layer 12, and the second electric conductor layer 32 is formed at a position of a transmission line 21A and a transmission line 32A.

In step S13, the inside of the through-hole 41 is filled with an electric conductor by plating. Thus, a via 40 that electrically connects the transmission line 21A to the transmission line 32A is formed. The transmission line 32A functions as, for example, an external connection terminal for the transmission line 21A. Incidentally, the surface of the inside of the through-hole 41 may be covered by plating, and the remaining space may be filled with a synthetic resin.

In step S14, the circuit layer 21 and the second electric conductor layer 32 of the double-sided copper-clad fluororesin substrate are subjected to an etching process to form the transmission line 21A of the circuit layer 21 and the transmission line 32A of the second electric conductor layer 32.

In step S15, a single-sided fluororesin substrate is bonded on the circuit layer 21 side. The single-sided fluororesin substrate includes a fluororesin substrate constituting a first dielectric layer 11 and copper constituting a first electric conductor layer 31. In step S15, bonding is performed with an adhesive 60 such that the first dielectric layer 11 and the circuit layer 21 face with each other. The adhesive 60 is, for example, a bonding sheet. The bonding sheet is used for bonding between layers of the substrates. The bonding sheet has insulating properties and adhesiveness.

In step S21 subsequent to step S15, in the first electric conductor layer 31 and the second electric conductor layer 32, portions where an electromagnetic wave shield 50 is to be formed are removed by etching, as illustrated in FIG. 5. Hereinafter, in the first electric conductor layer 31, the portion where the electromagnetic wave shield 50 is to be formed, that is, the part that has been removed by etching is referred to as a first etched portion 31C. In the second electric conductor layer 32, the portion where the electromagnetic wave shield 50 is to be formed, that is, the part that has been removed by etching is referred to as a second etched portion 32C.

As illustrated in FIG. 3, the first etched portion 31C and the second etched portion 32C are formed so as to surround the periphery of the transmission line 21A. In the first etched portion 31C, the first dielectric layer 11 is exposed. In the second etched portion 32C, the second dielectric layer 12 is exposed.

In step S22, a first hole 51 and a second hole 52 for the electromagnetic wave shield 50 are formed in the first dielectric layer 11 and the second dielectric layer 12, respectively, by laser processing. The laser processing is performed from both surface sides of the resulting substrate. Specifically, the first hole 51 in the first dielectric layer 11 is formed by irradiating the first dielectric layer 11 exposed by the first etched portion 31C with a laser. In a way, the first hole 51 is formed so as to extend through the first electric conductor layer 31. The laser applied to the first dielectric layer 11 is scanned along the first etched portion 31C surrounding the periphery of the transmission line 21A. As a result, the first hole 51 surrounding the periphery of the transmission line 21A is formed in the first dielectric layer 11. This first hole 51 is an elongated hole extending so as to surround the transmission line 21A in plan view. Accordingly, in the embodiment, the periphery of the transmission line 21A can be surrounded by the single first hole 51 on the first dielectric layer 11 side.

Laser processing is suitable for forming the first hole 51 according to the embodiment because a long and narrow hole can be easily formed by laser scanning. The first hole 51 formed in the first dielectric layer 11 need not be a single hole but may be separated into a plurality of portions.

The first hole 51 is formed so as to extend through the first dielectric layer 11 and the layer of the adhesive 60 without extending through the ground pattern 21B of the circuit layer 21. In addition, the first hole 51 formed by laser processing has an opening whose size increases toward the first etched portion 31C, which is on the laser irradiation side, and decreases toward the circuit layer 21. Specifically, the first hole 51 has a shape that tapers toward the deeper side, which is the circuit layer 21 side, in the depth direction of the first hole 51, that is, has a tapered shape. In other words, the size of the opening of the first hole 51 increases as the distance from the circuit layer 21 increases. Since the laser is applied from the first etched portion 31C side, the energy of the laser is absorbed in the first dielectric layer 11 on the side close to the first etched portion 31C. The energy reaching to the side away from the first etched portion 31C decreases. By using this, the first hole 51 having the tapered shape can be formed. The laser output for laser processing is adjusted to an appropriate magnitude such that the tapered shape is formed without extension through the ground pattern 21B.

The second hole 52 in the second dielectric layer 12 is formed by irradiating the second dielectric layer 12 exposed by the second etched portion 32C with a laser. In a way, the second hole 52 is formed so as to extend through the second electric conductor layer 32. The laser applied to the second dielectric layer 12 is scanned along the second etched portion 32C surrounding the periphery of the transmission line 21A. As a result, the second hole 52 surrounding the periphery of the transmission line 21A is formed in the second dielectric layer 12. This second hole 52 is an elongated hole extending so as to surround the transmission line 21A in plan view. Accordingly, in the embodiment, the periphery of the transmission line 21A can be surrounded by the single second hole 52 on the second dielectric layer 12 side.

Laser processing is suitable for forming the second hole 52 according to the embodiment because a long and narrow hole can be easily formed by laser scanning. The second hole 52 formed in the second dielectric layer 12 need not be a single hole but may be separated into a plurality of portions.

As illustrated in FIG. 1, the second hole 52 includes a first hole portion 52A extending in a longitudinal direction of the transmission line 21A on one side of the transmission line 21A in a width direction and a second hole portion 52B extending in the longitudinal direction of the transmission line 21A on the other side of the transmission line 21A in the width direction. The first hole portion 52A and the second hole portion 52B are provided at such positions that the transmission line 21A is disposed between the first hole portion 52A and the second hole portion 52B. In addition, the second hole 52 includes a third hole portion 52C connecting the first hole portion 52A to the second hole portion 52B. The third hole portion 52C connects the first hole portion 52A to the second hole portion 52B on one end side of the first hole portion 52A and the second hole portion 52B in the longitudinal direction and constitutes the single second hole 52 as a whole. A hole portion connecting the first hole portion 52A to the second hole portion 52B on the other end side of the first hole portion 52A and the second hole portion 52B in the longitudinal direction may be provided. The width direction of the transmission line 21A is the X direction in FIG. 1. The one side in the width direction is the left side in FIG. 1. The other side in the width direction is the right side in FIG. 1. The longitudinal direction of the transmission line 21A is the Y direction in FIG. 1. FIG. 1 illustrates an example of the case where the planar shape of the third hole portion 52C is a curved shape; however, the planar shape may be a linear shape.

The second hole 52 has a longitudinal dimension L in a direction in which the transmission line 21A is surrounded and a width dimension W in a direction orthogonal to the direction of the longitudinal dimension L. The longitudinal dimension L of the second hole 52 is larger than the width dimension W thereof. The longitudinal dimension L is preferably more than 5 times larger than the width dimension W. The longitudinal dimension L is more preferably more than 10 times larger than the width dimension W, still more preferably more than 15 times larger than the width dimension W, and still more preferably more than 20 times larger than the width dimension W.

In the embodiment, the first hole 51 has the same shape as the second hole 52 in plan view. The first hole 51 includes, as in the second hole 52, a first hole portion extending in the longitudinal direction of the transmission line 21A on one side of the transmission line 21A in the width direction and a second hole portion extending in the longitudinal direction of the transmission line 21A on the other side of the transmission line 21A in the width direction. In addition, the first hole 51 includes a third hole portion connecting the first hole portion to the second hole portion. The single first hole 51 is constituted by the first hole portion, the second hole portion, and the third hole portion as in the second hole 52.

The first hole 51 has a longitudinal dimension L in the direction in which the transmission line 21A is surrounded and a width dimension W in the direction orthogonal to the direction of the longitudinal dimension L, as in the second hole 52. The longitudinal dimension L of the first hole 51 is larger than the width dimension W thereof. The longitudinal dimension L is preferably more than 5 times larger than the width dimension W. The longitudinal dimension L is more preferably more than 10 times larger than the width dimension W, still more preferably more than 15 times larger than the width dimension W, and still more preferably more than 15 times larger than the width dimension W.

The second hole 52 is formed so as to extend through the second dielectric layer 12 without extending through the ground pattern 21B of the circuit layer 21. In addition, the second hole 52 formed by laser processing has an opening whose size increases toward the second etched portion 32C, which is on the laser irradiation side, and decreases toward the circuit layer 21. Specifically, the second hole 52 has a shape that tapers toward the deeper side, which is the circuit layer 21 side, in the depth direction of the second hole 52, that is, has a tapered shape. In other words, the size of the opening of the second hole 52 increases as the distance from the circuit layer 21 increases.

The first hole 51 and the second hole 52 are provided at the same position in plan view of the high-frequency circuit 10. Therefore, if the first hole 51 and the second hole 52 are formed so as to extend through the ground pattern 21B, the first hole 51 and the second hole 52 communicate with each other to form a single hole. In this case, in the high-frequency circuit 10, a portion within the area surrounded by the first hole 51 and the second hole 52, that is, a portion in which the transmission line 21A is provided, and a portion outside the area surrounded by the first hole 51 and the second hole 52 are separated from each other. In the following description, the first hole 51 and the second hole 52 may be collectively referred to as holes 51 and 52.

In the embodiment, the first hole 51 on the first dielectric layer 11 side and the second hole 52 on the second dielectric layer 12 side are separated by the ground pattern 21B. Accordingly, the two holes 51 and 52 do not communicate with each other. Specifically, in the high-frequency circuit 10 according to the embodiment, although the holes 51 and 52 extend through the first dielectric layer 11 and the second dielectric layer 12, respectively, a partially connected portion is provided in the thickness direction of the high-frequency circuit 10, that is, in the Z direction, and a hole that extends through the whole is not formed. Accordingly, even though the holes 51 and 52 surrounding the transmission line 21A are formed, the portion in which the transmission line 21A is provided can be prevented from being separated.

In the embodiment, the first hole 51 and the second hole 52 are provided at the same position in plan view of the high-frequency circuit 10; however, the first hole 51 and the second hole 52 may be provided at different positions in plan view of the high-frequency circuit 10. For example, the second hole 52 may be formed so as to surround the transmission line 21A on the inner peripheral side or the outer peripheral side of the first hole 51 surrounding the transmission line 21A. In this case, in a portion where the first hole 51 is formed, the ground pattern 21B of the circuit layer 21 and the second dielectric layer 12 are present. In a portion where the second hole 52 is formed, the ground pattern 21B of the circuit layer 21 and the first dielectric layer 11 are present. This structure can prevent the thickness of the high-frequency circuit 10 from being locally decreased in the portion where the first hole 51 or the second hole 52 is formed. In this case, the planar shape of the first hole 51 and the planar shape of the second hole 52 may be the same or different. The longitudinal dimension L of the first hole 51 and the longitudinal dimension L of the second hole 52 may be the same or different. The width dimension W of the first hole 51 and the width dimension W of the second hole 52 may be the same or different.

For the laser processing for forming the holes 51 and 52, it is preferable to use a laser that is suitable for perforation of a dielectric substance such as a synthetic resin, e.g., a fluororesin but that is not suitable for perforation of a metal, which is an electric conductor, that is, a material having high reflectivity. Such a laser is, for example, a carbon dioxide gas ($CO_2$) laser. Even if a carbon dioxide laser is applied to a material having high reflectivity, such as copper, the laser is reflected and thus processing is difficult. Accordingly, the use of a carbon dioxide laser easily avoids extension through the ground pattern 21B composed of copper, while forming the first hole 51 extending through the first dielectric layer 11 or the second hole 52 extending through the second dielectric layer 12.

In the embodiment, prior to the laser processing, the first etched portion 31C and the second etched portion 32C are respectively formed in the first electric conductor layer 31 and second electric conductor layer 32 composed of copper, which is not suitable for laser processing with a carbon dioxide laser. Thus, the first dielectric layer 11 and the second dielectric layer 12 can be subjected to the laser processing.

If a laser also suitable for processing a metal is used to form the holes 51 and 52, it is desirable to appropriately adjust the laser output or the laser output time such that the holes do not extend through the ground pattern 21B.

In step S23, electric conductors 53 and 54 are formed on the inner surfaces of the holes 51 and 52, the first etched portion 31C, and the second etched portion 32C by plating. FIG. 2 illustrates a case where the electric conductor 53 is disposed in contact with the entire inner surface of the first hole 51, and the electric conductor 53 includes a tubular portion having an outer peripheral shape corresponding to the inner peripheral shape of the first hole 51. Similarly, the electric conductor 54 is also disposed in contact with the entire inner surface of the second hole 52, and the electric conductor 54 includes a tubular portion having an outer peripheral shape corresponding to the inner peripheral shape of the second hole 52. The electric conductors 53 and 54 may be formed only on the inner surfaces of the holes 51 and 52, the first etched portion 31C, and the second etched portion 32C or may be formed so as to completely fill the inside of the holes 51 and 52, the first etched portion 31C, and the second etched portion 32C. The inside of the electric conductors 53 and 54 may be filled with a dielectric substance such as a synthetic resin or may be filled with an electric conductor such as a conductive paste.

The electric conductor 53 electrically connects the ground pattern 21B of the circuit layer 21 to the ground pattern 31B of the first electric conductor layer 31. Accordingly, the electric conductor 53 has an electric potential equal to that of the ground patterns 21B and 31B and thus serves as a ground electric conductor that forms a first ground electric conductor. The electric conductor 53 which is a ground electric conductor is disposed in the first hole 51 surrounding the periphery of the transmission line 21A and thus functions as the electromagnetic wave shield 50 surrounding the periphery of the transmission line 21A. The electric conductor 53 which is a ground electric conductor can shield electromagnetic waves radiated through the first dielectric layer 11.

The electric conductor 54 electrically connects the ground pattern 21B of the circuit layer 21 to the ground pattern 32B of the second electric conductor layer 32. Accordingly, the electric conductor 54 has an electric potential equal to that of the ground patterns 21B and 32B and thus serves as a ground electric conductor that forms a second ground electric conductor. The electric conductor 54 which is a ground electric conductor is disposed in the second hole 52 surrounding the periphery of the transmission line 21A and thus functions as the electromagnetic wave shield 50 surrounding the periphery of the transmission line 21A. The electric conductor 54 which is a ground electric conductor can shield electromagnetic waves radiated through the second dielectric layer 12.

As described above, the holes 51 and 52 in which the electric conductors 53 and 54 are formed have tapered shapes. This facilitates the detection of plating defects generated in the plating process for forming the electric conductors 53 and 54. The electric conductors 53 and 54 need to be formed so as to be in contact with the ground pattern 21B. However, a plating solution cannot sufficiently enter the inside of the fine holes 51 and 52, and a electroplating defect 90, which is a portion lacking the electric conductors 53 and 54, may be generated on the deeper side of the holes 51 and 52 (refer to FIG. 6).

Figure 6:
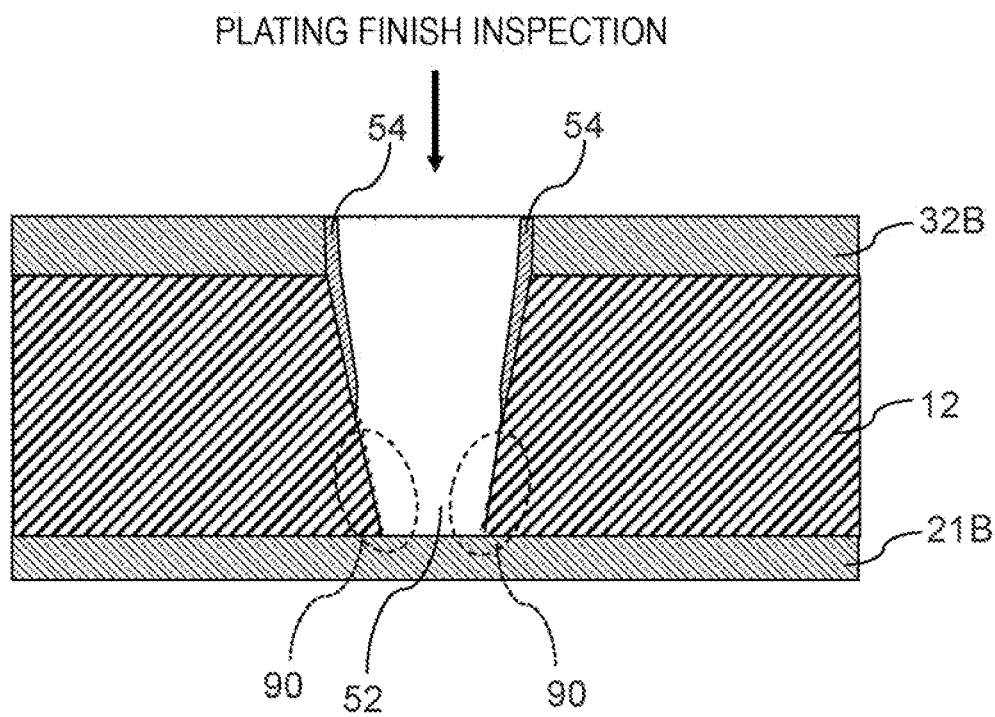
FIG. 6 is an explanatory view of a plating finish inspection for detecting a electroplating defect.

In a plating finish inspection, it is desired that the holes 51 and 52 are observed with, for example, a microscope to check whether or not the electroplating defect 90 is generated. If the holes 51 and 52 do not have tapered shapes but have straight shapes, even when a electroplating defect 90 is generated on the deeper side of the holes 51 and 52, it is difficult to detect the electroplating defect 90 because the electroplating defect 90 on the deeper side is hidden by the electric conductors 53 and 54 on the shallower side of the holes 51 and 52. In contrast to this, as illustrated in FIG. 6, if the holes 51 and 52 have tapered shapes, and a electroplating defect 90 is generated on the deeper side of the holes 51 and 52, the electroplating defect 90 can be detected by observation from the shallower side of the holes 51 and 52.

In step S24, cover films 71 and 72 are applied to the surfaces of the first electric conductor layer 31 and the second electric conductor layer 32 with adhesives 81 and 82, respectively, therebetween. The cover films 71 and 72 are composed of, for example, a polyimide, and protect the first electric conductor layer 31 and the second electric conductor layer 32, respectively. The application of the cover films 71 and 72 can ensure the strength of the high-frequency circuit 10 in which the holes 51 and 52 are formed.

It is to be understood that the embodiment disclosed herein is only illustrative and non-restrictive in all respects. The scope of the present invention is defined not by the meaning described above but by the claims, and is intended to include meaning equivalents to the scope of the claims and all modifications within the scope of the claims.

REFERENCE SIGNS LIST

10: high-frequency circuit
11: first dielectric layer
12: second dielectric layer
21: circuit layer
21A: transmission line
21B: ground pattern
31: first electric conductor layer
31B: ground pattern
31C: first etched portion
32: second electric conductor layer
32A: transmission line
32B: ground pattern
32C: second etched portion
40: via
41: through-hole
50: electromagnetic wave shield
51: first hole
52: second hole
52A: first hole portion
52B: second hole portion
52C: third hole portion
53: electric conductor, first ground electric conductor
54: electric conductor, second ground electric conductor
60: adhesive
71: cover film
72: cover film
81: adhesive
82: adhesive
90: electroplating defect
100: high-frequency circuit
101: signal transmission line
102: shield via
L: longitudinal dimension
W: width dimension

The invention claimed is:

1. A high-frequency circuit comprising:
a first dielectric layer;
a circuit layer disposed on the first dielectric layer and including a transmission line of a high-frequency signal and a ground pattern disposed around the transmission line;
a second dielectric layer disposed such that the circuit layer is located between the first dielectric layer and the second dielectric layer; and
an electromagnetic wave shield disposed in the first dielectric layer and the second dielectric layer around the transmission line, wherein the electromagnetic wave shield includes
- a first ground electric conductor formed on an inner surface of at least one first hole formed to extend through the first dielectric layer without extending through the ground pattern,
- a second ground electric conductor formed on an inner surface of at least one second hole formed to extend through the second dielectric layer without extending through the ground pattern, and
- an adhesive disposed between the first dielectric layer and the circuit layer, the adhesive being also disposed between the transmission line included in the circuit layer and the ground pattern included in the circuit layer in plan view, and the first ground electric conductor and the second ground electric conductor are each electrically connected to the ground pattern.

2. The high-frequency circuit according to claim 1,
wherein the at least one first hole includes at least one first elongated hole having a longitudinal dimension in a direction in which the transmission line is surrounded, the longitudinal dimension being larger than a width dimension.

3. The high-frequency circuit according to claim 1,
wherein the at least one second hole includes at least one second elongated hole having a longitudinal dimension in a direction in which the transmission line is surrounded, the longitudinal dimension being larger than a width dimension.

4. The high-frequency circuit according to claim 1,
wherein the at least one first hole includes at least one first elongated hole having a longitudinal dimension in a direction in which the transmission line is surrounded, the longitudinal dimension being larger than a width dimension,
the at least one second hole includes at least one second elongated hole having a longitudinal dimension in a direction in which the transmission line is surrounded, the longitudinal dimension being larger than a width dimension, and
each of the first elongated hole and the second elongated hole includes
- a first hole portion extending in a longitudinal direction of the transmission line on one side of the transmission line in a width direction,
- a second hole portion extending in the longitudinal direction of the transmission line on the other side of the transmission line in the width direction, and
- a third hole portion connecting the first hole portion to the second hole portion.

5. The high-frequency circuit according to claim 1,
wherein each of the first hole and the second hole has a shape in which a size of an opening increases as a distance from the circuit layer increases.

6. The high-frequency circuit according to claim 1, further comprising:
- a first electric conductor layer disposed such that the first dielectric layer is located between the circuit layer and the first electric conductor layer; and
- a second electric conductor layer disposed such that the second dielectric layer is located between the circuit layer and the second electric conductor layer, wherein the first hole is formed to extend through the first electric conductor layer, and
the second hole is formed to extend through the second electric conductor layer.

7. The high-frequency circuit according to claim 6,
wherein the first electric conductor layer is electrically connected to the first ground electric conductor, and
the second electric conductor layer is electrically connected to the second ground electric conductor.

8. The high-frequency circuit according to claim 6, further comprising:
a cover film applied to a surface of at least one of the first electric conductor layer and the second electric conductor layer.

9. The high-frequency circuit according to claim 1,
wherein the adhesive is at least one selected from a modified polyphenylene ether-based adhesive, styrene resin-based adhesive, epoxy resin-based adhesive, butyral resin-based adhesive, or acrylic resin-based adhesive.

10. The high-frequency circuit according to claim 1, wherein
the adhesive includes a thermosetting resin, and
a lower limit of a curing temperature of the thermosetting resin is 120° C., and an upper limit of the curing temperature of the thermosetting resin is 250° C.

11. The high-frequency circuit according to claim 1,
wherein the second dielectric layer is only in direct contact with the circuit layer while the first dielectric layer is only in indirect contact with the circuit layer via the adhesive.

12. The high-frequency circuit according to claim 1,
wherein the first hole is formed to extend through the first dielectric layer and the adhesive without extending through the ground pattern.

13. The high-frequency circuit according to claim 1,
wherein the transmission line of the circuit layer is completely surrounded by the adhesive in the plan view.

* * * * *